(12) United States Patent
Li et al.

(10) Patent No.: US 8,553,425 B2
(45) Date of Patent: Oct. 8, 2013

(54) PORTABLE ELECTRONIC DEVICE WITH ANTI-REVERSE ENGINEERING FUNCTION

(75) Inventors: Tsung-Hsi Li, New Taipei (TW); Ming-Chih Hsieh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 338 days.

(21) Appl. No.: 13/171,470

(22) Filed: Jun. 29, 2011

(65) Prior Publication Data
US 2012/0275111 A1 Nov. 1, 2012

(30) Foreign Application Priority Data

Apr. 29, 2011 (TW) .............................. 100115057 A

(51) Int. Cl.
*H05K 5/00* (2006.01)

(52) U.S. Cl.
USPC ..................................... 361/759; 361/679.57

(58) Field of Classification Search
USPC ........................................... 361/759, 679.57
See application file for complete search history.

(56) References Cited

U.S. PATENT DOCUMENTS

| | | | | |
|---|---|---|---|---|
| 4,149,158 A * | 4/1979 | Iwaoka et al. | ................ | 725/151 |
| 4,811,288 A * | 3/1989 | Kleijne et al. | .................. | 365/52 |
| 5,621,387 A * | 4/1997 | Phillips et al. | ............ | 340/545.6 |
| 5,790,670 A * | 8/1998 | Bramlett | ......................... | 380/52 |
| 5,991,164 A * | 11/1999 | Saito et al. | ..................... | 361/799 |
| 6,087,939 A * | 7/2000 | Leyden et al. | ............. | 340/568.2 |
| 6,512,454 B2 * | 1/2003 | Miglioli et al. | ............... | 340/541 |
| 6,774,807 B1 * | 8/2004 | Lehfeldt et al. | ............ | 340/686.1 |
| 7,049,970 B2 * | 5/2006 | Allen et al. | ..................... | 340/590 |
| 7,671,276 B2 * | 3/2010 | Baker | ............................. | 174/50 |

* cited by examiner

*Primary Examiner* — Ramon Barrera
(74) *Attorney, Agent, or Firm* — Altis & Wispro Law Group, Inc.

(57) ABSTRACT

An exemplary portable electronic device includes a housing, a circuit board, starting module set on the circuit board for starting the portable electronic device, and an assembly module. The assembly module helps assembles the housing and the circuit board together and forms a part of circuitry associated with the starting module. When the assembly module is disassembled from the housing and the circuit board, the starting module cannot start the portable electronic device.

19 Claims, 3 Drawing Sheets

PORTABLE ELECTRONIC DEVICE WITH ANTI-REVERSE ENGINEERING FUNCTION

BACKGROUND

1. Technical Field

The disclosure generally relates to portable electronic devices, and particularly to a portable electronic device which cannot be started when the portable electronic device is disassembled.

2. Description of Related Art

Manufacturers usually need much time and money to design and make new products. However, once a new product is on the market, commercial competitors of the manufacturer may reverse engineer the new product. That is, a competitor may disassemble the new product to learn the electronic and mechanical structures of the new product. The competitor can further analyze the functions of the new product after starting to disassemble the new product.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the disclosure.

DETAILED DESCRIPTION

Figure 1:
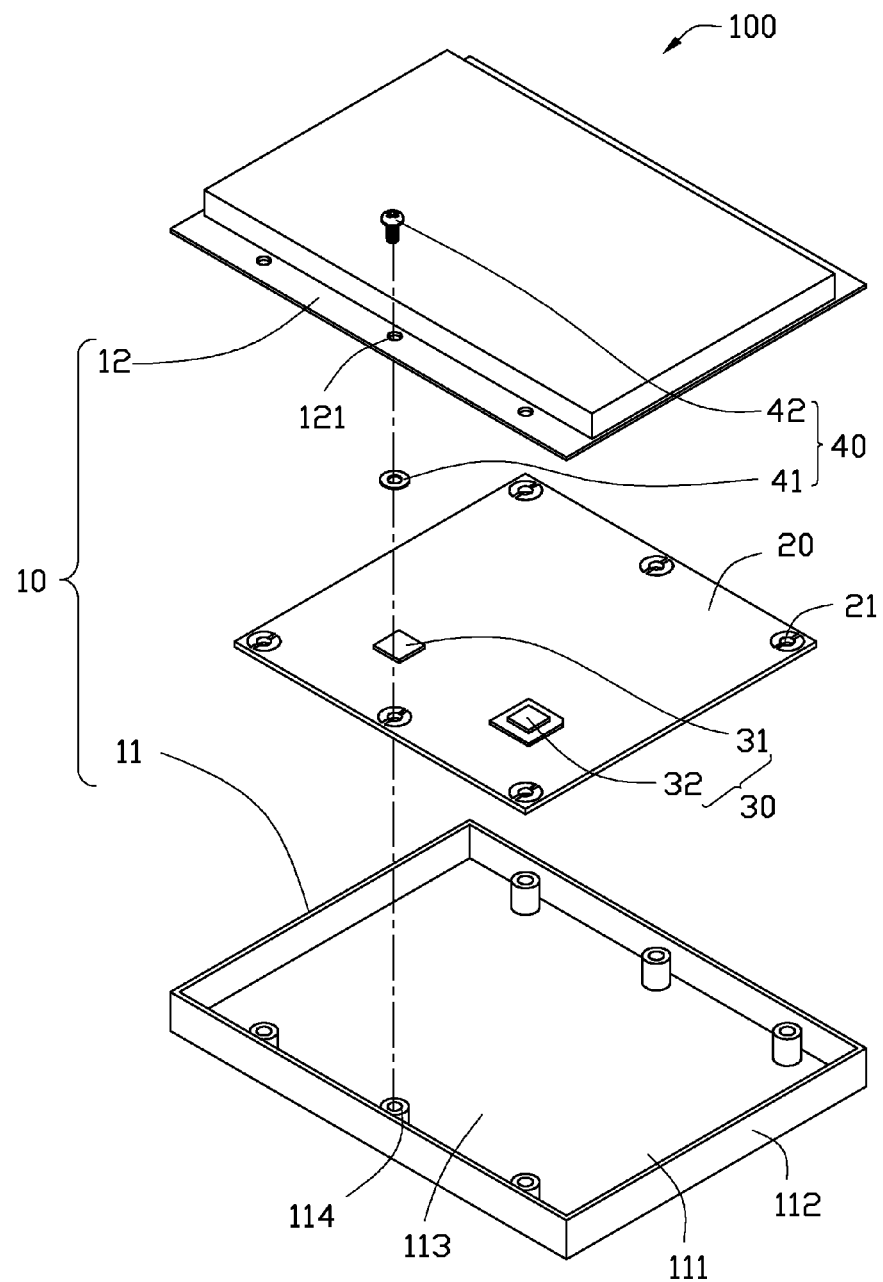
FIG. 1 is a schematic, exploded view of a portable electronic device, according to an exemplary embodiment.
Figure 2:
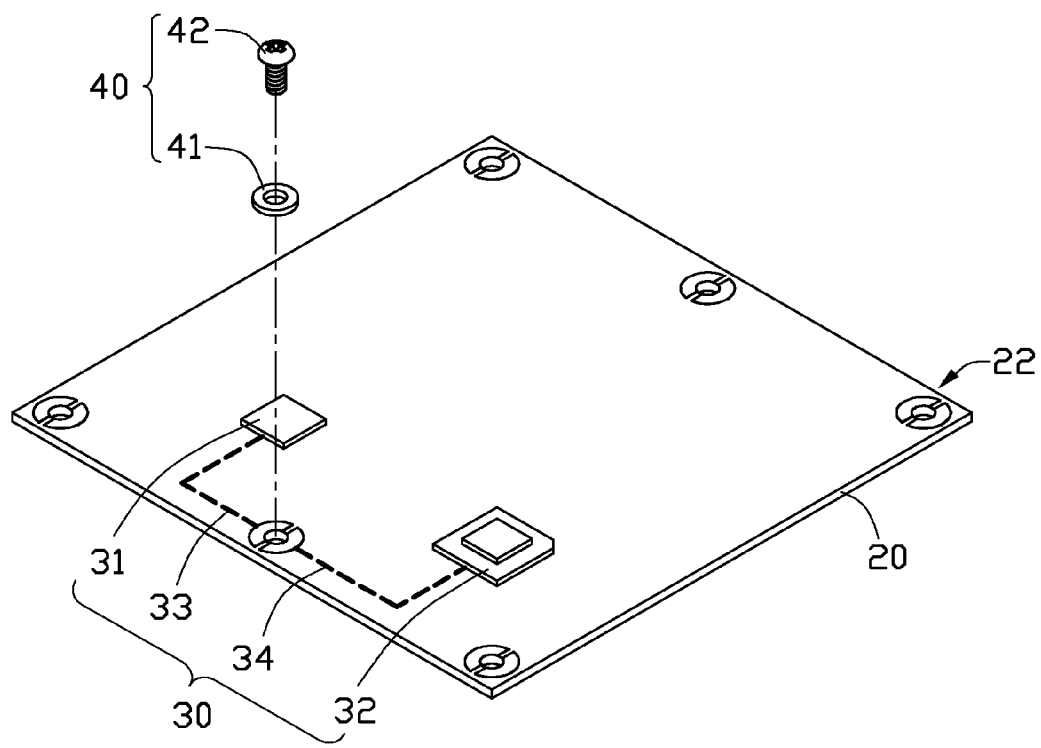
FIG. 2 is a partially disassembled view of an assembly module and a circuit board of the portable electronic device of FIG. 1.
Figure 3:
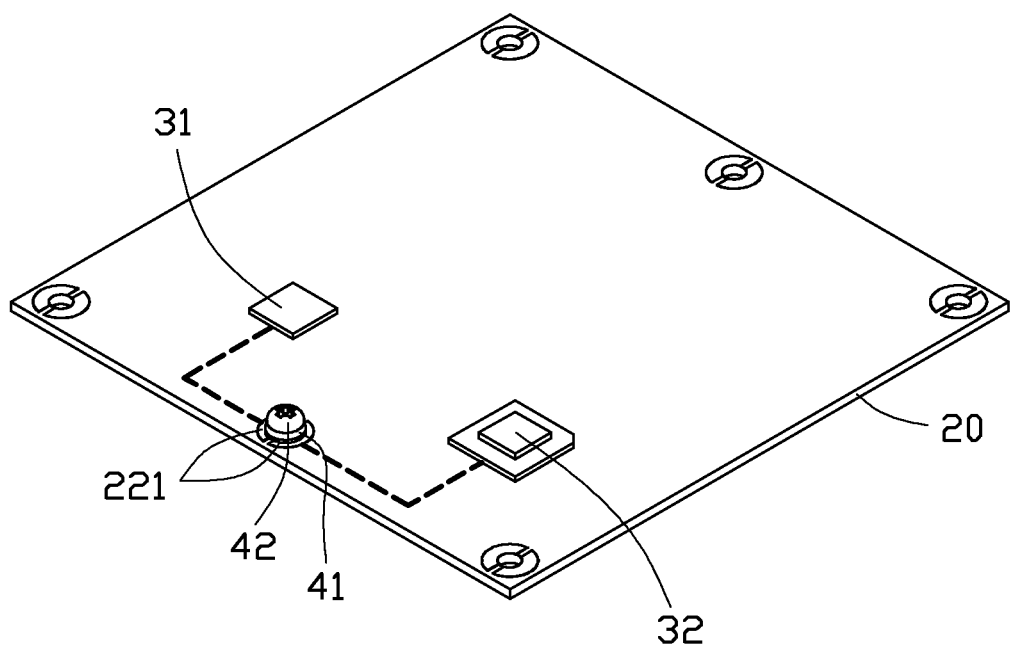
FIG. 3 is an assembled view of the assembly module and the circuit board of FIG. 2.

FIG. 1 is a schematic, exploded view of a portable electronic device 100, according to an exemplary embodiment. The portable electronic device 100 includes a housing 10, a circuit board 20, a starting module 30, and an assembly module 40. The assembly module 40 assembles the housing 10 and the circuit board 20 together. When the assembly module 40 is disassembled from the housing 10 and the circuit board 20, the portable electronic device 100 cannot be started by the starting module 30.

The housing 10 includes a case 11 and a cover 12. The case 11 includes a bottom wall 111, and four side walls 112 extending perpendicularly up from four sides of the bottom wall 111. The four side walls 112 together with the bottom wall 111 form a receiving space 113 for receiving the circuit board 20. A plurality of positioning posts 114 extend up from two sides of the bottom wall 111.

The cover 12 is matched with the case 11, and can be attached to the case 11 with the help of the assembly module 40. A plurality of positioning holes 121 are defined in two sides of the cover 12, corresponding to the positioning posts 11.

The circuit board 20 is a substantially rectangular board, which is received in the receiving space 113. A plurality of mounting holes 21 are defined in the circuit board 20. The mounting holes 21 correspond to the positioning posts 114 and the positioning holes 121. When the circuit board 20 is received in the receiving space 113, the mounting holes 21 are aligned with the positioning posts 114 and the positioning holes 121. A plurality of pad groups 22 are attached on the circuit board 20, corresponding to the mounting holes 21. Each pad group 22 includes two opposite pads 221 surrounding the corresponding mounting hole 21. Each pad 221 is substantially a semi-annular conductive sheet.

The starting module 30 includes a first starting member 31, a second starting member 32, a first connecting wire 33, and a second connecting wire 34. The first starting member 31 may be a central processing unit (CPU). The second starting member 32 may be a power supply for the CPU. The first and second starting members 31, 32 may be integrated circuits for starting the portable electronic device 100. The first and second starting members 31, 32 are set on the circuit board 20 and are connected to the pads 221 in one of the pad groups 22 by the first and second connecting wires 33, 34. In particular, the first connecting wire 33 connects the first starting member 31 to one pad 221 of the one pad group 22. The second connecting wire 34 connects the second starting member 32 to the other pad 221 of the one pad group 22. The first and second connecting wires 33, 34 are set inside the circuit board 20, and are invisible from the outside of the circuit board 20. When the two pads 221 of the pad group 22 are electrically connected, that is, the first starting member 31 is electrically connected to the second starting member 32, the portable electronic device 100 can be started. Otherwise, the portable electronic device 100 cannot be started.

The assembly module 40 includes a conductive member 41, and an assembly member 42. The conductive member 41 may be a metallic annular sheet or washer. The conductive member 41 can be attached to the pad group 22 to electrically interconnect the two pads 221. The assembly member 42 may be a screw or bolt, etc. The assembly member 42 can extend through the corresponding positioning hole 121, the conductive member 41, and the corresponding mounting hole 21, and engage with the corresponding positioning post 114. Thus, the case 11, the cover 12, and the circuit board 20 can be assembled together with the help of the assembly member 42. In addition, the conductive member 41 is sandwiched between the circuit board 20 and the cover 12, and attached to the pad group 22. Thereby, electrical connection between the first starting member 31 and the second starting member 32 is completed by the conductive member 41, and the portable electronic device 100 can be started.

When the assembly member 42 is disengaged from the positioning post 114 and the portable electronic device 100 is disassembled, the conductive member 41 is detached from the pad group 22. Thus, the first starting member 31 is electrically disconnected from the second starting member 32, and the portable electronic device 100 cannot be started. Therefore even though the portable electronic device 100 is disassembled, the working principles of the portable electronic device 100 cannot be easily further analyzed.

In other embodiments, the conductive member 41 can be omitted. When the case 11, the cover 12, and the circuit board 20 are assembled together with the help of the assembly member 42, the assembly member 42 contacts the pads 221 surrounding the mounting hole 21, and thereby electrically interconnects the first connecting wire 33 and the second connecting wire 34. Thus, the portable electronic device 100 can be started.

In the above-described alternative embodiment, when the assembly member 42 is disengaged from the positioning post 114 and detached from the pads 221, the first connecting member 31 is electrically disconnected from the second connecting member 32. Thus, the portable electronic device 100 cannot be started by the starting module 30.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A portable electronic device, comprising:
a housing;
a circuit board;
a starting module set on the circuit board for starting the portable electronic device; and
an assembly module which helps assemble the housing and the circuit board together and which forms a part of circuitry associated with the starting module; wherein when the assembly module is disassembled from the housing and the circuit board, the starting module cannot start the portable electronic device.

2. The portable electronic device of claim 1, wherein the starting module includes a first starting member and a second starting member, and when the assembly module helps assemble the housing and the circuit board together, the first starting member is electrically connected to the second starting member, and when the assembly member is disassembled from the housing and the circuit board, the first starting member is disconnected from the second starting member.

3. The portable electronic device of claim 2, wherein the circuit board defines at least one mounting hole, at least two pads are attached to the circuit board surrounding the at least one mounting hole, and the first and second starting members are connected to the two pads, respectively.

4. The portable electronic device of claim 3, wherein each pad is substantially a semi-annular conductive sheet.

5. The portable electronic device of claim 3, wherein the housing includes a case and a cover, the case includes a plurality of positioning posts, the cover defines a plurality of positioning holes corresponding to the positioning posts, the assembly module includes an assembly member, and the assembly member extends through one of the positioning holes and the at least one mounting hole, and engages with one of the positioning posts.

6. The portable electronic device of claim 5, wherein the assembly member is a screw or a bolt.

7. The portable electronic device of claim 3, wherein the first and second starting members are respectively connected to one of the two pads by a first connecting wire and a second connecting wire, and the first and second connecting wires are set inside the circuit board.

8. The portable electronic device of claim 3, wherein the assembly member further includes a conductive member, which is attached to the two pads when the assembly member helps assemble the housing and the circuit board together and is detached from the pads when the assembly member is disassembled from the housing and the circuit board.

9. The portable electronic device of claim 3, wherein the conductive member is a metallic annular sheet or washer.

10. The portable electronic device of claim 2, wherein the first starting member is a central processing unit (CPU), and the second starting member is a power supply for the first starting member.

11. A portable electronic device, comprising:
a housing;
a circuit board;
a starting module set on the circuit board and configured for starting the portable electronic device, the starting module including a first starting member and a second starting member; and
an assembly module which helps assemble the housing and the circuit board together and which forms a part of a circuit including the first starting member and the second starting member; wherein when the assembly module is removed from engagement with the housing and the circuit board, the circuit between the first starting member and the second starting member is broken.

12. The portable electronic device of claim 11, wherein the circuit board defines at least one mounting hole, at least two pads are attached to the circuit board surrounding the at least one mounting hole, the first and second starting members are respectively connected to one of the two pads.

13. The portable electronic device of claim 12, wherein each pad is a semi-annular conductive sheet.

14. The portable electronic device of claim 12, wherein the housing includes a case, and a cover, the case includes a plurality of positioning posts, the cover defines a plurality of positioning holes corresponding to the positioning posts, the assembly module includes an assembly member, the assembly member extends through one of the corresponding positioning holes, and the at least one mounting hole, and engages with one of the corresponding positioning posts.

15. The portable electronic device of claim 14, wherein the assembly member is a screw.

16. The portable electronic device of claim 12, wherein the first and second starting members are respectively connected to one of the two pads by a first connecting wire and a second connecting wire, the first and second connecting wires are set inside the circuit board.

17. The portable electronic device of claim 12, wherein the assembly member further includes a conductive member, which is attached to the two pads when the assembly member assembles the housing and the circuit board together and is detached from the pads when the assembly member is disassembled from the housing and the circuit board.

18. The portable electronic device of claim 17, wherein the conductive member is a metallic annular sheet.

19. The portable electronic device of claim 11, wherein the first starting member is a central processing unit (CPU), and the second starting member is a power supply for the first starting member.

* * * * *